(12) United States Patent
Hung et al.

(10) Patent No.: US 9,312,879 B2
(45) Date of Patent: Apr. 12, 2016

(54) SIGNAL MODULATING DEVICE CAPABLE OF REDUCING PEAKING IN SIGNAL TRANSFER FUNCTION

(71) Applicant: MEDIATEK INC., Hsin-Chu (TW)

(72) Inventors: Li-Han Hung, Taipei (TW); Yen-Chuan Huang, Hsinchu County (TW); Chi-Yun Wang, Tainan (TW); Chih-Hong Lou, Yilan County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/600,017

(22) Filed: Jan. 20, 2015

(65) Prior Publication Data

US 2016/0056835 A1    Feb. 25, 2016

Related U.S. Application Data

(63) Continuation-in-part of application No. 14/467,066, filed on Aug. 25, 2014.

(60) Provisional application No. 62/069,335, filed on Oct. 28, 2014.

(51) Int. Cl.
*H03M 3/00* (2006.01)

(52) U.S. Cl.
CPC .................................... *H03M 3/354* (2013.01)

(58) Field of Classification Search
CPC ....... H03M 3/458; H03M 3/424; H03M 3/37; H03M 3/43; H03M 3/454; H03M 3/404; H03M 3/438; H03M 3/40; H03M 3/344; H03M 3/402; H03M 3/368; H03M 1/80; H03H 17/0251; H03H 17/0289

USPC ........................... 341/130–172; 375/295, 296
See application file for complete search history.

(56) References Cited

U.S. PATENT DOCUMENTS 3,729,666 A    4/1973  Kelly
4,301,446 A    11/1981 Petit
(Continued)

FOREIGN PATENT DOCUMENTS

EP         2 346 167 A1    7/2011

OTHER PUBLICATIONS

Kazuo Matsukawa, A 5th-order Delta-Sigma Modulator with Single-Opamp Resonator, Symposium on VLSI Circuits Digest of Technical Papers, 2009, 68-69.
(Continued)

*Primary Examiner* — Lam T Mai
(74) *Attorney, Agent, or Firm* — Winston Hsu; Scott Margo

(57) ABSTRACT

A signal modulating device includes: an integrating circuit arranged to generate an integrated signal according to a scaled analog signal and a first feedback signal; a resonating circuit arranged to generate a resonating signal according to the integrated signal; a first signal converting circuit arranged to convert the resonating signal into a digital output signal; a second signal converting circuit arranged to convert the digital output signal into the first feedback signal; and a first impedance circuit having a first terminal receiving an analog signal and a second terminal coupled to the resonating circuit for altering the location of zeros in the forward-path transfer function and consequently shaping the signal transfer function (STF) of the signal modulating device; and a second impedance circuit having a first terminal receiving the analog signal and a second terminal coupled to the integrating circuit for generating the scaled analog signal.

16 Claims, 7 Drawing Sheets

(56) References Cited

U.S. PATENT DOCUMENTS

| | | | | |
|---|---|---|---|---|
| 4,984,292 A | | 1/1991 | Millen | |
| 5,392,042 A | * | 2/1995 | Pellon | H03M 3/404 333/166 |
| 5,500,645 A | * | 3/1996 | Ribner | H03M 3/414 341/118 |
| 5,673,044 A | * | 9/1997 | Pellon | H03H 17/04 341/143 |
| 5,917,440 A | * | 6/1999 | Khoury | H03M 3/404 341/122 |
| 6,157,329 A | * | 12/2000 | Lee | H03M 3/408 341/133 |
| 6,954,159 B1 | * | 10/2005 | Cooper | H03M 3/368 341/143 |
| 7,075,468 B1 | * | 7/2006 | Pellon | H03M 3/37 341/143 |
| 7,242,336 B1 | * | 7/2007 | Jensen | H03M 3/396 341/143 |
| 7,504,976 B1 | * | 3/2009 | Pellon | H04L 27/36 341/143 |
| 8,013,771 B2 | * | 9/2011 | Booth | H03M 1/80 341/144 |
| 8,044,718 B2 | | 10/2011 | Nicollini | |
| 8,497,791 B2 | | 7/2013 | Okumura | |
| 2010/0097258 A1 | * | 4/2010 | Koli | H03H 15/00 341/155 |
| 2011/0148679 A1 | * | 6/2011 | Karthaus | H03M 3/394 341/143 |
| 2012/0262320 A1 | | 10/2012 | Mitani | |
| 2013/0214951 A1 | * | 8/2013 | Ho | H03M 3/37 341/143 |

OTHER PUBLICATIONS

Kazuo Matsukawa, A Fifth-Order Continuous-Time Delta-Sigma Modulator With Single-Opamp Resonator, IEEE Journal of Solid-State Circuits, Apr. 2010, 697-706, vol. 45, No. 4.

\* cited by examiner

US 9,312,879 B2

SIGNAL MODULATING DEVICE CAPABLE OF REDUCING PEAKING IN SIGNAL TRANSFER FUNCTION

CROSS REFERENCE TO RELATED APPLICATIONS

This application is a continuation-in-part of U.S. application Ser. No. 14/467,066, which was filed on 2014 Aug. 25, entitled "RESONATING DEVICE WITH SINGLE OPERATIONAL AMPLIFIER", and this CIP application further claims the benefit of U.S. Provision No. 62/069,335, which was filed on 2014 Oct. 28.

BACKGROUND

The present invention relates to a signal modulating device, and more particular to a continuous-time sigma-delta modulator.

For a continuous-time sigma-delta modulator (CT-SDM), the feed-forward topologies are often chosen over feedback topologies because the feed-forward topologies has lower internal signal swings and fewer feedback digital-to-analog elements. However, the feed-forward topologies exhibit large out-of-band peaking in signal transfer function (STF), which can be a problem in wireless applications having strong interferers/blockers. More specifically, the out-of-band peaking can reduce the amount of filtering provided by baseband or intermediate-frequency filters when out-of-band interferers are presented and result in degraded dynamic range of the modulator. Meanwhile, larger out-of-band signals can potentially overload the input of quantizer and lead to an unstable modulator. Therefore, how to reduce the out-of-band signals of a continuous-time sigma-delta modulator is an urgent problem in the field of wireless communications.

SUMMARY

The objective of the present embodiment is to provide a continuous-time sigma-delta modulator having no or reduced peaking in signal transfer function (STF).

According to an embodiment of the present invention, a signal modulating device is provided. The signal modulating device comprises an integrating circuit, a resonating circuit, a first signal converting circuit, a second signal converting circuit, a first impedance circuit, and a second impedance circuit. The integrating circuit is arranged to generate an integrated signal according to a scaled analog signal and a first feedback signal. The resonating circuit is arranged to generate a resonating signal according to the integrated signal. The first signal converting circuit is arranged to convert the resonating signal into a digital output signal. The second signal converting circuit is arranged to convert the digital output signal into the first feedback signal. The first impedance circuit has a first terminal receiving the analog signal and a second terminal coupled to the resonating circuit for altering the location of zeros in the forward-path transfer function and consequently shaping the STF of the presented signal modulating device. The second impedance circuit has a first terminal receiving the analog signal and a second terminal coupled to the integrating circuit to generate the scaled analog signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
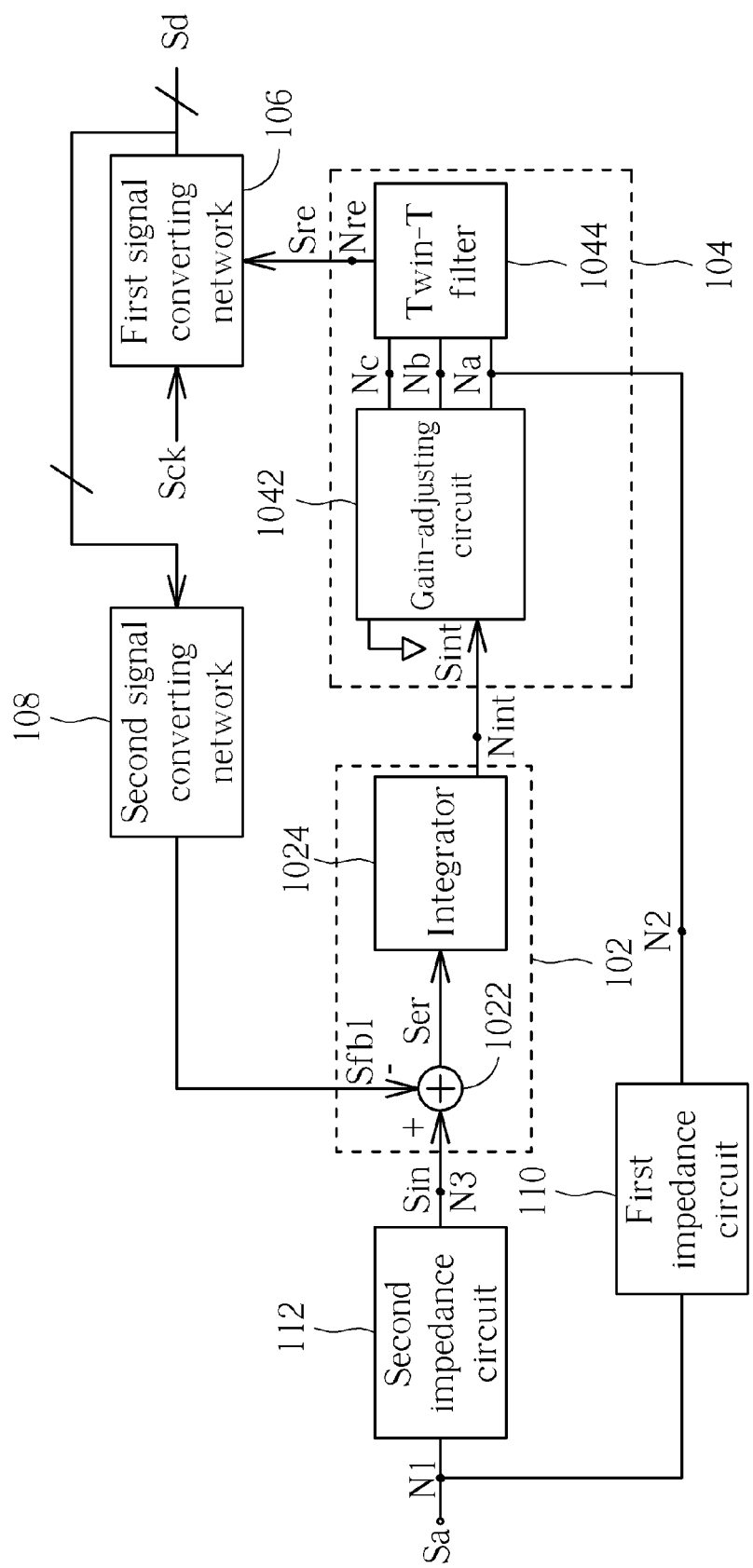
FIG. 1 is a diagram illustrating a signal modulating device according to an embodiment of the present invention.

Please refer to FIG. 1, which is a diagram illustrating a signal modulating device 100 according to an embodiment of the present invention. The signal modulating device 100 may be a continuous-time sigma-delta modulator (CT-SDM) or a continuous-time sigma-delta modulating analog-to-digital converter (CT-SDM ADC). The signal modulating device 100 comprises an integrating circuit 102, a resonating circuit 104, a first signal converting circuit 106, a second signal converting circuit 108, a first impedance circuit 110, and a second impedance circuit 112. The integrating circuit 102 is arranged to generate an integrated signal Sint on the output terminal Nint according to a scaled analog signal Sin and a first feedback signal Sfb1. The resonating circuit 104 is arranged to generate a resonating signal Sre on the output terminal Nre according to the integrated signal Sint. The first signal converting circuit 106 is clocked by a clock signal Sck and is arranged to convert the resonating signal Sre into a digital output signal Sd in each clock period. The second signal converting circuit 108 is arranged to convert the digital output signal Sd into the first feedback signal Sfb1. The first impedance circuit 110 has a first terminal N1 receiving the analog signal Sa and a second terminal N2 coupled to the resonating circuit 104 for altering the location of zeros in the forward-path transfer function and consequently shaping the signal transfer function (STF) of the signal modulating device 100.

The second impedance circuit 112 has a first terminal (i.e. N1) receiving the analog signal Sa and a second terminal N3 coupled to the integrating circuit 102 for generating the scaled analog signal Sin.

The integrating circuit 102 comprises a combining circuit 1022 and an integrator 1024. The combining circuit 1022 is arranged to generate a combining signal Ser according to the scaled analog signal Sin and the first feedback signal Sfb1. The integrator 1024 is arranged to integrate the combining signal Ser to generate the integrated signal Sint. The resonating circuit 104 is a single-operational-amplifier resonator, and the resonating circuit 104 comprises a gain-adjusting circuit 1042 and a twin-T filter 1044. The gain-adjusting circuit 1042 connects to the twin-T filter 1044 via three terminals Na, Nb, and Nc, as shown in FIG. 1. The first signal converting circuit 106 is an analog-to-digital converter, and the second signal converting circuit 108 is a digital-to-analog converter. In addition, the combining signal Ser is a difference between the scaled analog signal Sin and the first feedback signal Sfb1.

The first impedance circuit 110 may be a frequency-independent circuit alone or in combination with a frequency-dependent circuit for shaping STF of the signal modulating device 100 differently. In addition, the second impedance circuit 112 is limited to be a frequency-independent circuit throughout the present invention.

Figure 2:
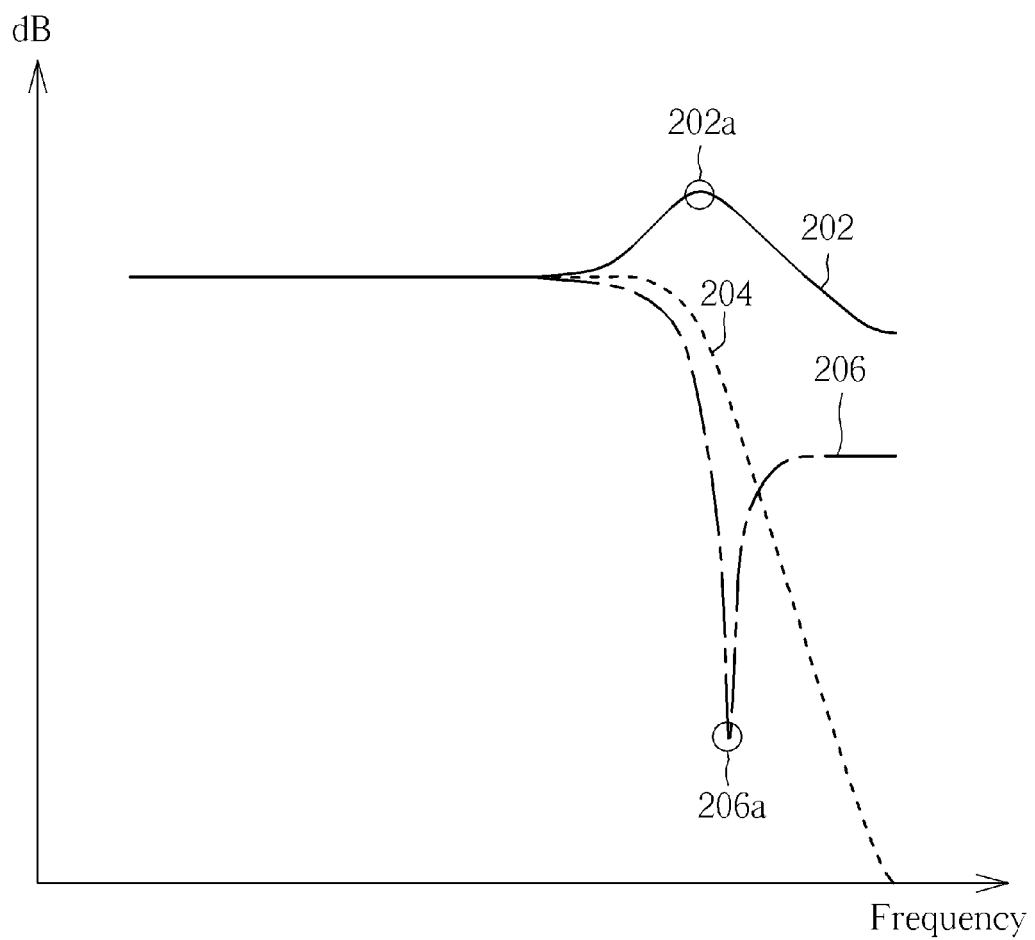
FIG. 2 is a diagram illustrating the responses of a conventional continuous-time sigma-delta modulator, a signal modulating device with a first impedance circuit having frequency-independent circuit, and a signal modulating device with the first impedance circuit having frequency-independent circuit and frequency-dependent circuit according to an embodiment of the present invention.

FIG. 2 is a diagram illustrating the responses of STF of continuous-time sigma-delta modulators, in which the curve 202 is the response of the conventional continuous-time sigma-delta modulator, the curve 204 is the response of the present signal modulating device 100 with the first impedance circuit 110 having frequency-independent circuit, and the curve 206 is the response of the present signal modulating device 100 with the first impedance circuit 110 having frequency-independent circuit and frequency-dependent circuit.

Without using the first impedance circuit 110, the STF response 202 of the conventional continuous-time sigma-delta modulator has a peak 202a at out-of-band frequencies. When the first impedance circuit 110 having frequency-independent circuit is applied in the signal modulating device 100, zeros in forward-path transfer function may be removed. Therefore, the peak is eliminated in this all-pole STF response 204. In addition, when the first impedance circuit 110 having frequency-independent circuit and frequency-dependent circuit is applied in the signal modulating device 100, a notch may be induced in forward-path transfer function and the remaining zero may be pushed to higher out-of-band frequencies. Therefore, the peak is eliminated and a notch 206a is presented in the stop-band in this elliptic-like STF response 206.

Figure 3:
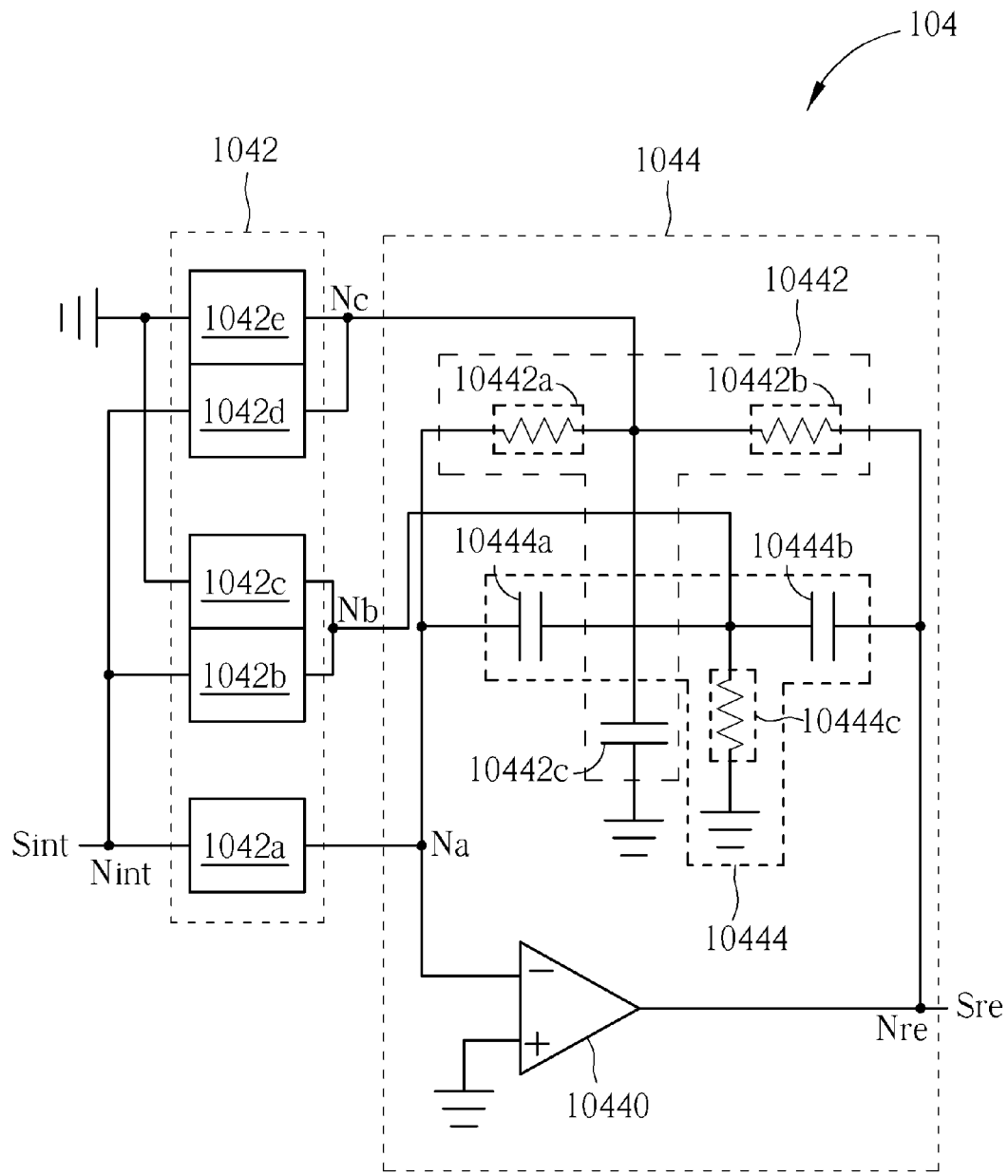
FIG. 3 is a diagram illustrating a generalized resonating circuit according to an embodiment of the present invention.

Please refer to FIG. 3, which is a diagram illustrating a single-ended implementation of a generalized resonating circuit 104 according to an embodiment of the present invention. The resonating circuit 104 comprises a gain-adjusting circuit 1042 and a twin-T filter 1044. The gain-adjusting circuit 1042 has input terminals for receiving the integrated signal Sint or a reference voltage, and output terminals coupled to input terminals Na, Nb, and Nc of the twin-T filter 1044 for adjusting gain on each path from Sint to Sre, wherein Na is the first input terminal (i.e. the negative input terminal) of an amplifying circuit 10440, Nb is an intermediate terminal of a second feedback circuit 10444, and Nc is an intermediate terminal of a first feedback circuit 10442.

The twin-T filter 1044 comprises the amplifying circuit 10440, the first feedback circuit 10442, and the second feedback circuit 10444. The amplifying circuit 10440 has two input terminals with positive one coupled to a reference voltage and negative one (i.e. terminal Na) coupled to input terminals of the first feedback and the second feedback circuits 10442, 10444. In addition, the amplifying circuit 10440 has an output terminal Nre for outputting the resonating signal Sre, to where other input terminals of the first feedback and the second feedback circuits 10442, 10444 coupled.

According to the embodiment, to satisfy the resonating condition of the resonating device 104, the gain-adjusting circuit 1042, the first feedback circuit 10442, and the second feedback circuit 10444 are chosen so that equivalent impedance connecting onto the intermediate terminal Nb is substantially equals to the equivalent impedance connecting onto the intermediate terminal Nc.

More specifically, the first feedback circuit 10442 comprises a first resistor 10442a, a second resistor 10442b, and a first capacitor 10442c. The first resistor 10442a has a first terminal coupled to the negative input terminal Na of the amplifying circuit 10440. The second resistor 10442b has a first terminal coupled to a second terminal of the first resistor 10442a, and a second terminal coupled to the output terminal of the amplifying circuit 10440. The first capacitor 10442c has a first terminal coupled to the second terminal of the first resistor 10442a, and a second terminal coupled to a reference voltage, wherein the second terminal of the first resistor 10442a is the intermediate terminal Nc of the first feedback circuit 10442.

The second feedback circuit 10444 comprises a second capacitor 10444a, a third capacitor 10444b, and a third resistor 10444c. The second capacitor 10444a has a first terminal coupled to the negative input terminal Na of the amplifying circuit 10440. The third capacitor 10444b has a first terminal coupled to a second terminal of the second capacitor 10444a, and a second terminal coupled to the output terminal of the amplifying circuit 10440. The third resistor 10444c has a first terminal coupled to the second terminal of the second capacitor 10444a, and a second terminal coupled to a reference voltage, wherein the second terminal of the second capacitor 10444a is the intermediate terminal Nb of the second feedback circuit 10444.

In general, the gain adjusting circuit 1042 comprises a first impedance circuit 1042a, a second impedance circuit 1042b, a third impedance circuit 1042c, a fourth impedance circuit 1042d, and a fifth impedance circuit 1042e. The first impedance circuit 1042a is coupled between the terminal Nint and the negative input terminal Na of the amplifying circuit 10440. The second impedance circuit 1042b is coupled between the terminal Nint and the intermediate terminal Nb of the second feedback circuit 10444. The third impedance circuit 1042c is coupled between a reference voltage and the intermediate terminal Nb of the second feedback circuit 10444. The fourth impedance circuit 1042d is coupled between the terminal Nint and the intermediate terminal Nc of the first feedback circuit 10442. The fifth impedance circuit 1042e is coupled between a reference voltage and the intermediate terminal Nc of the first feedback circuit 10442.

In present invention, the first impedance circuit 110 couples input analog signal of the signal modulating device 100 to the negative input terminal Na of the amplifying circuit 10444. If the first impedance circuit 110 is a frequency-independent circuit, the forward-path transfer function G(s) of the signal modulating device 100 can be represent by the following equations (1), (2), and (3):

$$G(s) = G_P(s) + \frac{(1+s \cdot nrc) \cdot (b_{FI})}{s^2 + g} \rightarrow \frac{b_1 a_3}{s(s^2+g)} \left(\text{if } F_s = \frac{1}{T_s} = 1\right) \quad (1)$$

$$G_P(s) = \frac{b_1 \cdot (a_1 s^2 + a_2 s^1 + a_3 s^0)}{s(s^2+g)} \quad (2)$$

$$\frac{\left(R_{10442a} \| R_{10442b} \| \frac{1}{sC_{10442c}} \| Z_{1042e} \| Z_{1042d}\right)}{T_s} = \quad (3)$$

$$\frac{\left(\frac{1}{sC_{10444a}} \| \frac{1}{sC_{10444b}} \| R_{10444c} \| Z_{1042c} \| Z_{1042b}\right)}{T_s} = nrc$$

In which, b1 is set by the second impedance circuit 112, and bFI is set by frequency-independent components of the first impedance circuit 110. Gp(s) is the primitive forward-path transfer function without the inclusion of the first impedance circuit 110, and a1, a2, a3, and g are loop parameters, set by the resonating device 104, of the signal modulating device 100. Fs (Ts) is the frequency (period) of the clock signal Sck. To make equation (1) succinct, the ratio between equivalent time-constant product on the intermediate terminal Nb (or Nc) to the period of the clock signal Sck is represented by nrc. Consequently, zeros of the new forward-path transfer function G(s) are removed through proper selection on bFI and nrc. By knowing the fact from signal-flow analysis that STF is essentially the forward-path transfer function G(s) multiplied by the noise transfer function (NTF), a signal modulating device 100 whose STF is an all-pole response, or the curve 204 as shown in FIG. 2, is realized.

On the other hand, if the first impedance circuit 110 is a frequency-independent circuit in combination with a frequency-dependent circuit, the forward-path transfer function G(S) of the signal modulating device 100 can be represent by the following equation (4):

$$G(s) = G_P(s) + \frac{(1+s \cdot nrc) \cdot (b_{FI} + s b_{FD})}{s^2 + g} \rightarrow \quad (4)$$

$$\frac{(s^2+m)(s+\omega_z)}{s(s^2+g)} \left(\text{if } F_s = \frac{1}{T_s} = 1\right)$$

In which, bFI and bFD are set by frequency-independent components and frequency-dependent components of the first impedance circuit 110, respectively. Similarly, by designing bFI, bFD and nrc, the forward-path transfer function G(s) now has a notch at frequency m and the remaining zero at frequency ωz. If the notch frequency m is placed in the stop-band of STF, a signal modulating device 100 whose STF is an elliptic-like response, or the curve 206 as shown in FIG. 2, is realized.

Figure 4:
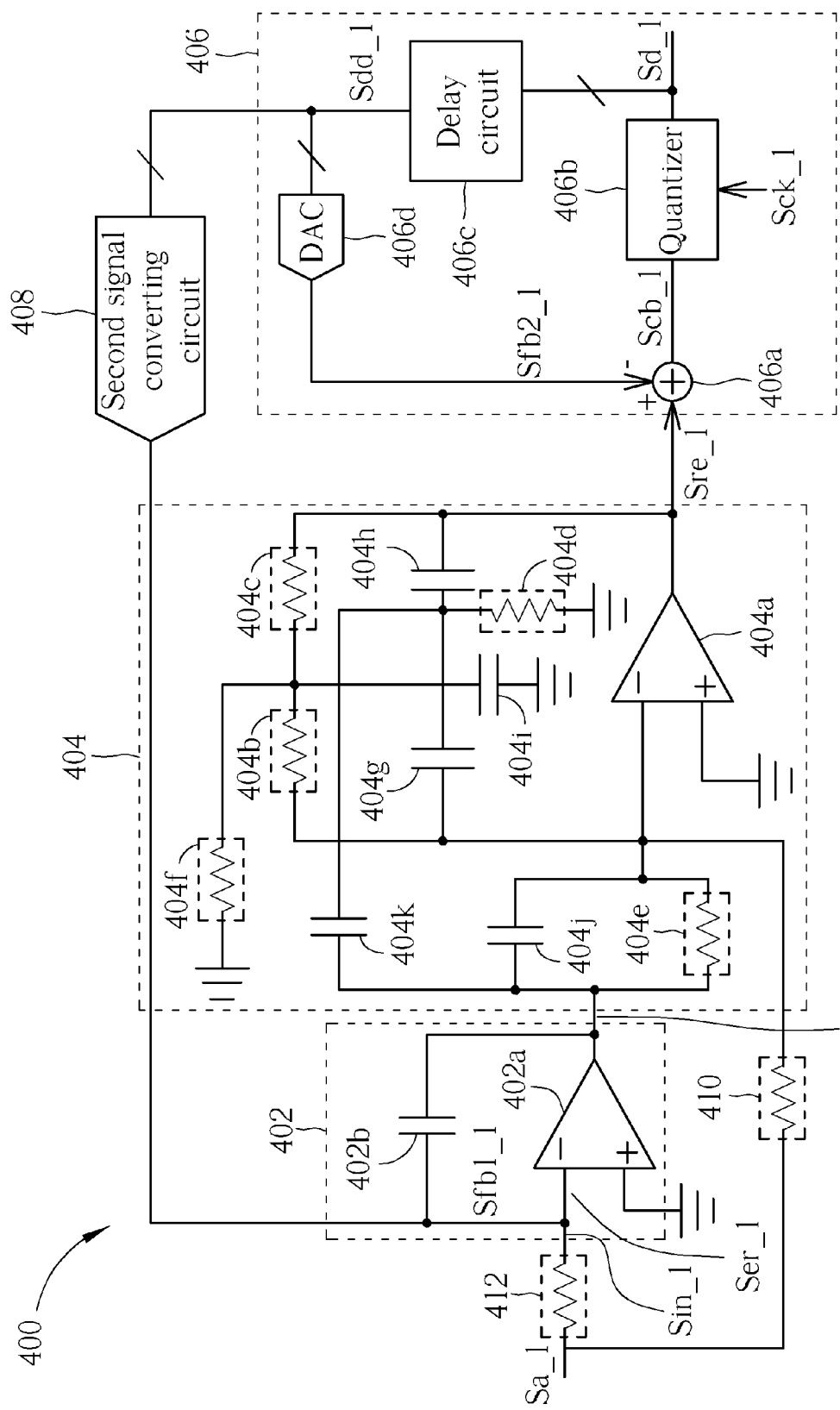
FIG. 4 is a diagram illustrating a single-ended continuous-time sigma-delta modulating device according to a first embodiment of the present invention.

Please refer to FIG. 4, which is a diagram illustrating a single-ended continuous-time sigma-delta modulating device 400 according to a first embodiment of the present invention. FIG. 4 shows a detailed schematic of an embodiment of the signal modulating device 100. The single-ended continuous-time sigma-delta modulating device 400 comprises an integrating circuit 402, a resonating circuit 404, a first signal converting circuit 406, a second signal converting circuit 408, a first impedance circuit 410, and a second impedance circuit 412. The integrating circuit 402 comprises an amplifying circuit 402a and a capacitor 402b. The amplifying circuit 402a has a first input terminal (i.e. the negative input terminal) receiving a combining signal Ser_1 of a scaled analog signal Sin_1 and a first feedback signal Sfb1_1, and a second input terminal (i.e. the positive input terminal) coupled to a reference voltage. The capacitor 402b has a first terminal coupled to the first input terminal of the amplifying circuit 402a and a second terminal coupled to an output terminal of the amplifying circuit 402a for outputting an integrated signal Sint_1.

The resonating circuit 404 comprises an amplifying circuit 404a, a plurality of resistors 404b-404f, and a plurality of capacitors 404g-404k. The amplifying circuit 404a is an operational amplifier having a negative input terminal, a positive input terminal, and an output terminal. The resistors 404b, 404c, and the capacitor 404i are configured to be a first feedback circuit of the amplifying circuit 404a, and the first feedback circuit is coupled between the negative input terminal and the output terminal of the amplifying circuit 404a. The capacitors 404g, 404h, and the resistor 404d are configured to be a second feedback circuit of the amplifying circuit 404a, and the second feedback circuit is coupled between the negative input terminal and the output terminal of the amplifying circuit 404a. The resistors 404e, 404f, and the capacitors 404j, 404k are configured to be a gain-adjusting circuit of the resonating circuit 404, and the gain-adjusting circuit is coupled to the negative input terminal of the amplifying circuit 404a, the intermediate terminal of the first feedback circuit (i.e. the common node of the resistors 404b, 404c, 404f, and the capacitor 404i), and the intermediate terminal of the second feedback circuit (i.e. the common node of the capacitors 404g, 404h, 404k, and the resistor 404d). The resonating circuit 404 is arranged to generate a resonating signal Sre_1 according to the integrated signal Sint_1. The connectivity of the elements in the resonating circuit 404 is shown in FIG. 4, thus the detailed description is omitted here for brevity.

The first signal converting circuit 406 comprises a combining circuit 406a, a quantizer 406b, a delay circuit 406c, and a digital-to-analog converter (DAC) 406d. The combining circuit 406a is arranged to generate a combining signal Scb_1 according to the resonating signal Sre_1 and a second feedback signal Sfb2_1. The quantizer 406b is clocked by a clock signal Sck_1 and is arranged to generate the digitized output signal Sd_1 of the combining signal Scb_1 in each clock period. The delay circuit 406c is arranged to delay the digital output signal Sd_1 to generate a delayed signal Sdd_1. The digital-to-analog converter 406d is arranged to generate the second feedback signal Sfb2_1 according to the delayed signal Sdd_1. According to the embodiment, the combining signal Scb_1 is a difference between the resonating signal Sre_1 and the second feedback signal Sfb2_1.

In addition, the second signal converting circuit 408 is arranged to convert the delayed signal Sdd_1, which is derived of the digital output signal Sd_1, into the first feedback signal Sfb1_1. The second impedance circuit 412 is a resistor having a first terminal receiving an analog signal Sa_1 and a second terminal coupled to the integrating circuit 402 for generating the scaled analog signal Sin_1. It is noted that the integrating circuit 402 generates the integrated signal Sint_1 according to the scaled analog signal Sin_1 and the first feedback signal Sfb1_1. The first impedance circuit 410 is a resistor having a first terminal for receiving the analog signal Sa_1, and a second terminal coupled to the negative input terminal of the amplifying circuit 404a.

As the first impedance circuit 410 is a frequency-independent component, i.e. the resistor, the response of the single-ended continuous-time sigma-delta modulating device 400 is similar to the curve 204 as shown in FIG. 2.

Figure 5:
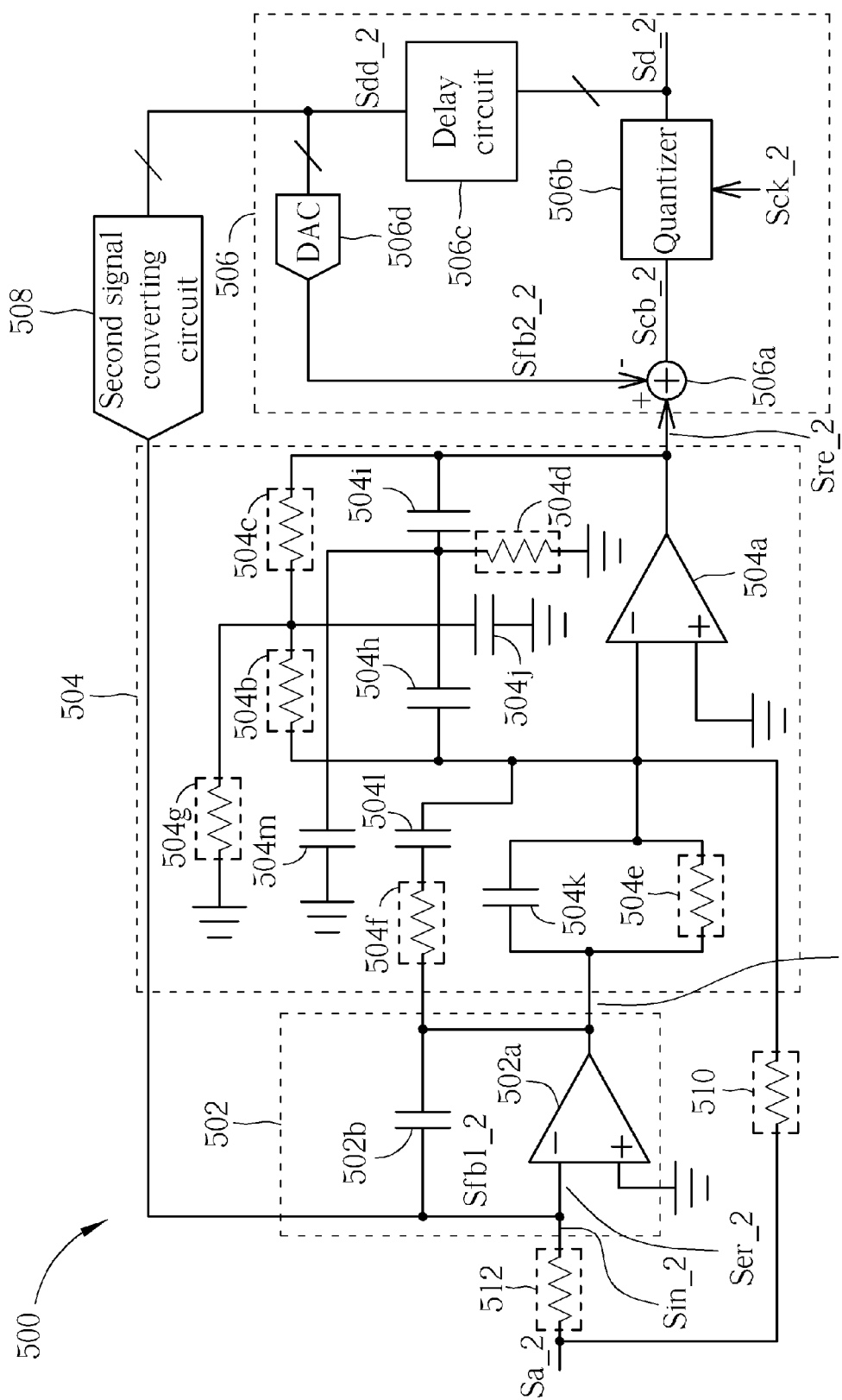
FIG. 5 is a diagram illustrating a single-ended continuous-time sigma-delta modulating device according to a second embodiment of the present invention.

Please refer to FIG. 5, which is a diagram illustrating a single-ended continuous-time sigma-delta modulating device 500 according to a second embodiment of the present invention. FIG. 5 shows a detailed schematic of another embodiment of the signal modulating device 100. The single-ended continuous-time sigma-delta modulating device 500 comprises an integrating circuit 502, a resonating circuit 504, a first signal converting circuit 506, a second signal converting circuit 508, a first impedance circuit 510, and a second impedance circuit 512. The integrating circuit 502 comprises an amplifying circuit 502a and a capacitor 502b. The amplifying circuit 502a has a first input terminal (i.e. the negative input terminal) receiving a combining signal Ser_2 of a scaled analog signal Sin_2 and a first feedback signal Sfb1_2, and a second input terminal (i.e. the positive input terminal) coupled to a reference voltage. The capacitor 502b has a first terminal coupled to the first input terminal of the amplifying circuit 502a and a second terminal coupled to an output terminal of the amplifying circuit 502a for outputting an integrated signal Sint_2.

The resonating circuit 504 comprises an amplifying circuit 504a, a plurality of resistors 504b-504g, and a plurality of capacitors 504h-504m. The amplifying circuit 504a is an operational amplifier having a negative input terminal, a positive input terminal, and an output terminal. The resistors 504b, 504c, and the capacitor 504j are configured to be a first feedback circuit of the amplifying circuit 504a, and the first feedback circuit is coupled between the negative input terminal and the output terminal of the amplifying circuit 504a. The capacitors 504h, 404i, and the resistor 504d are configured to be a second feedback circuit of the amplifying circuit 504a, and the second feedback circuit is coupled between the negative input terminal and the output terminal of the amplifying circuit 504a. The resistors 504e, 504f, 504g, and the capacitors 504k, 5041, 504m are configured to be a gain-adjusting circuit of the resonating circuit 504, and the gain-adjusting circuit is coupled to the negative input terminal of the amplifying circuit 504a, the intermediate terminal of the first feedback circuit (i.e. the common node of the resistors 504b, 504c, 504g, and the capacitor 504j), and the intermediate terminal of the second feedback circuit (i.e. the common node of the capacitors 504h, 504i, 504m, and the resistor 504d). The resonating circuit 504 is arranged to generate a resonating signal Sre_2 according to the integrated signal Sint_2. The connectivity of the elements in the resonating circuit 504 is shown in FIG. 5, thus the detailed description is omitted here for brevity.

The first signal converting circuit 506 comprises a combining circuit 506a, a quantizer 506b, a delay circuit 506c, and a digital-to-analog converter 506d. The combining circuit 506a is arranged to generate a combining signal Scb_2 according to the resonating signal Sre_2 and a second feedback signal Sfb2_2. The quantizer 506b is clocked by a clock signal Sck_2 and is arranged to generate the digitized output signal Sd_2 of the combining signal Scb_2 in each clock period The delay circuit 506c is arranged to delay the digital output signal Sd_2 to generate a delayed signal Sdd_2. The digital-to-analog converter 506d is arranged to generate the second feedback signal Sfb2_2 according to the delayed signal Sdd_2. According to the embodiment, the combining signal Scb_2 is a difference between the resonating signal Sre_2 and the second feedback signal Sfb2_2.

In addition, the second signal converting circuit 508 is arranged to convert the delayed signal Sdd_2, which is derived of the digital output signal Sd_2, into the first feedback signal Sfb1_2. The second impedance circuit 512 is a resistor having a first terminal receiving an analog signal Sa_2 and a second terminal coupled to the integrating circuit 502 for generating the scaled analog signal Sin_2. It is noted that the integrating circuit 502 generates the integrated signal Sint_2 according to the scaled analog signal Sin_2 and the first feedback signal Sfb1_2. The first impedance circuit 510 is a resistor having a first terminal for receiving the analog signal Sa_2, and a second terminal coupled to the negative input terminal of the amplifying circuit 504a.

As the first impedance circuit 510 is a frequency-independent component, i.e. the resistor, the response of the single-ended continuous-time sigma-delta modulating device 500 is similar to the curve 204 as shown in FIG. 2.

Figure 6:
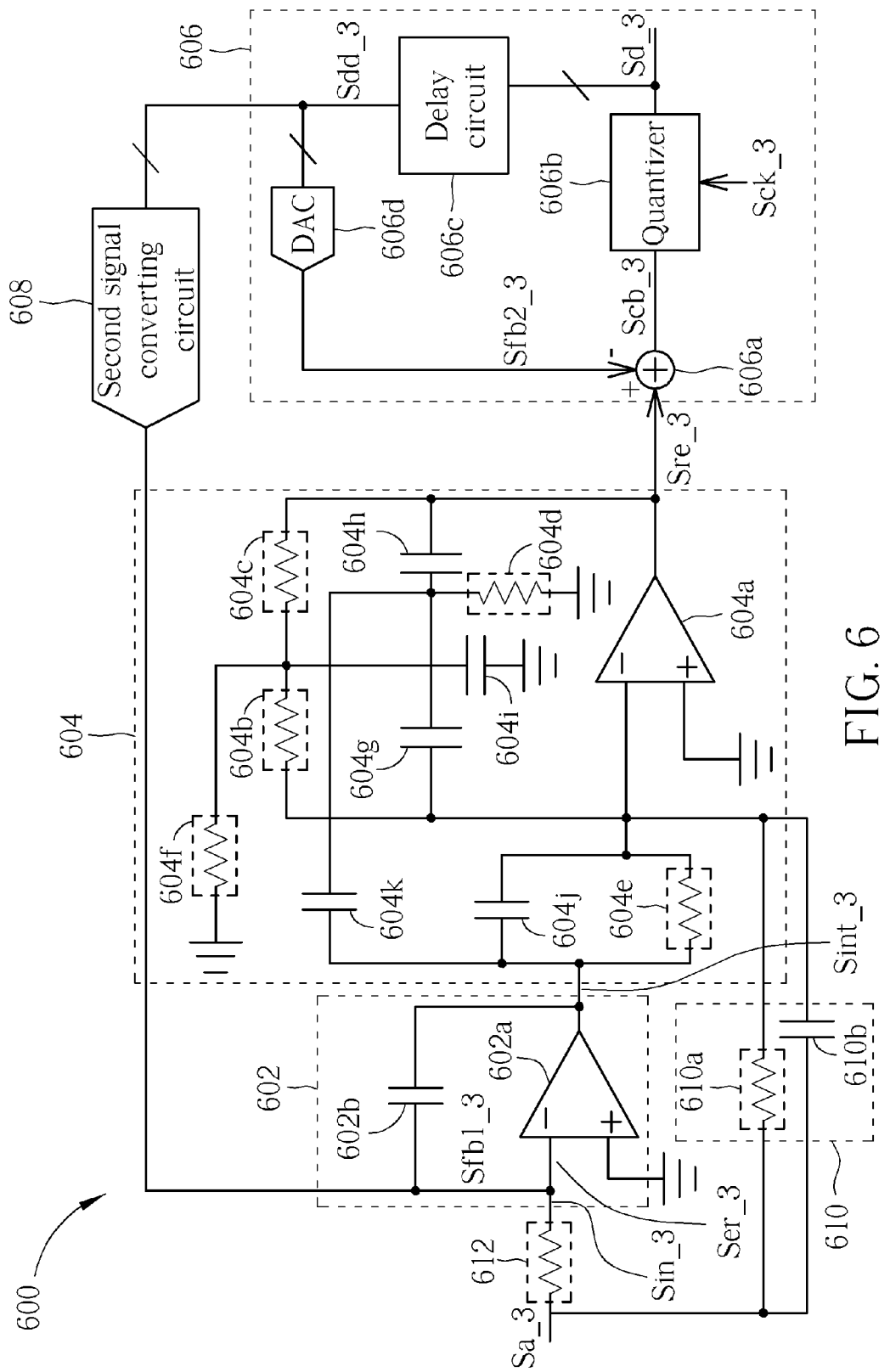
FIG. 6 is a diagram illustrating a single-ended continuous-time sigma-delta modulating device according to a third embodiment of the present invention.

Please refer to FIG. 6, which is a diagram illustrating a single-ended continuous-time sigma-delta modulating device 600 according to a third embodiment of the present invention. FIG. 6 shows a detailed schematic of another embodiment of the signal modulating device 100. The single-ended continuous-time sigma-delta modulating device 600 comprises an integrating circuit 602, a resonating circuit 604, a first signal converting circuit 606, a second signal converting circuit 608, a first impedance circuit 610, and a second impedance circuit 612. The integrating circuit 602 comprises an amplifying circuit 602a and a capacitor 602b. The amplifying circuit 602a has a first input terminal (i.e. the negative input terminal) receiving a combining signal Ser_3 of a scaled analog signal Sin_3 and a first feedback signal Sfb1_3, and a second input terminal (i.e. the positive input terminal) coupled to a reference voltage. The capacitor 602b has a first terminal coupled to the first input terminal of the amplifying circuit 602a and a second terminal coupled to an output terminal of the amplifying circuit 602a for outputting an integrated signal Sint_3.

The resonating circuit 604 comprises an amplifying circuit 604a, a plurality of resistors 604b-604f, and a plurality of capacitors 604g-604k. The amplifying circuit 604a is an operational amplifier having a negative input terminal, a positive input terminal, and an output terminal. The resistors 604b, 604c, and the capacitor 604i are configured to be a first feedback circuit of the amplifying circuit 604a, and the first feedback circuit is coupled between the negative input terminal and the output terminal of the amplifying circuit 604a. The capacitors 604g, 604h, and the resistor 604d are configured to be a second feedback circuit of the amplifying circuit 604a, and the second feedback circuit is coupled between the negative input terminal and the output terminal of the amplifying circuit 604a. The resistors 604e, 604f, and the capacitors 604j, 604k are configured to be a gain-adjusting circuit of the resonating circuit 604, and the gain-adjusting circuit is coupled to the negative input terminal of the amplifying circuit 604a, the intermediate terminal of the first feedback circuit (i.e. the common node of the resistors 604b, 604c, 604f, and the capacitor 604i), and the intermediate terminal of the second feedback circuit (i.e. the common node of the capacitors 604g, 604h, 604k, and the resistor 604d). The resonating circuit 604 is arranged to generate a resonating signal Sre_3 according to the integrated signal Sint_3. The connectivity of the elements in the resonating circuit 604 is shown in FIG. 6, thus the detailed description is omitted here for brevity.

The first signal converting circuit 606 comprises a combining circuit 606a, a quantizer 606b, a delay circuit 606c, and a digital-to-analog converter 606d. The combining circuit 606a is arranged to generate a combining signal Scb_3 according to the resonating signal Sre_3 and a second feedback signal Sfb2_3. The quantizer 606b is clocked by a clock signal Sck_3 and is arranged to generate the digitized output signal Sd_3 of the combining signal Scb_3 in each clock period. The delay circuit 606c is arranged to delay the digital output signal Sd_3 to generate a delayed signal Sdd_3. The digital-toanalog converter 606d is arranged to generate the second feedback signal Sfb2_3 according to the delayed signal Sdd_3. According to the embodiment, the combining signal Scb_3 is a difference between the resonating signal Sre_3 and the second feedback signal Sfb2_3.

In addition, the second signal converting circuit 608 is arranged to convert the delayed signal Sdd_3, which is derived of the digital output signal Sd_3, into the first feedback signal Sfb1_3. The second impedance circuit 612 is a resistor having a first terminal receiving an analog signal Sa_3 and a second terminal coupled to the integrating circuit 602 for generating the scaled analog signal Sin_3. It is noted that the integrating circuit 602 generates the integrated signal Sint_3 according to the scaled analog signal Sin_3 and the first feedback signal Sfb1_3. The first impedance circuit 610 comprises a resistor 610a and a capacitor 610b. The resistor 610a has a first terminal for receiving the analog signal Sa_3, and a second terminal coupled to the negative input terminal of the amplifying circuit 604a. The capacitor 610b also has a first terminal for receiving the analog signal Sa_3, and a second terminal coupled to the negative input terminal of the amplifying circuit 604a.

As the first impedance circuit 610 is a frequency-independent component, i.e. the resistor 610a, in combination with a frequency-dependent component, i.e. the capacitor 610b, the response of the single-ended continuous-time sigma-delta modulating device 600 is similar to the curve 206 as shown in FIG. 2.

Figure 7:
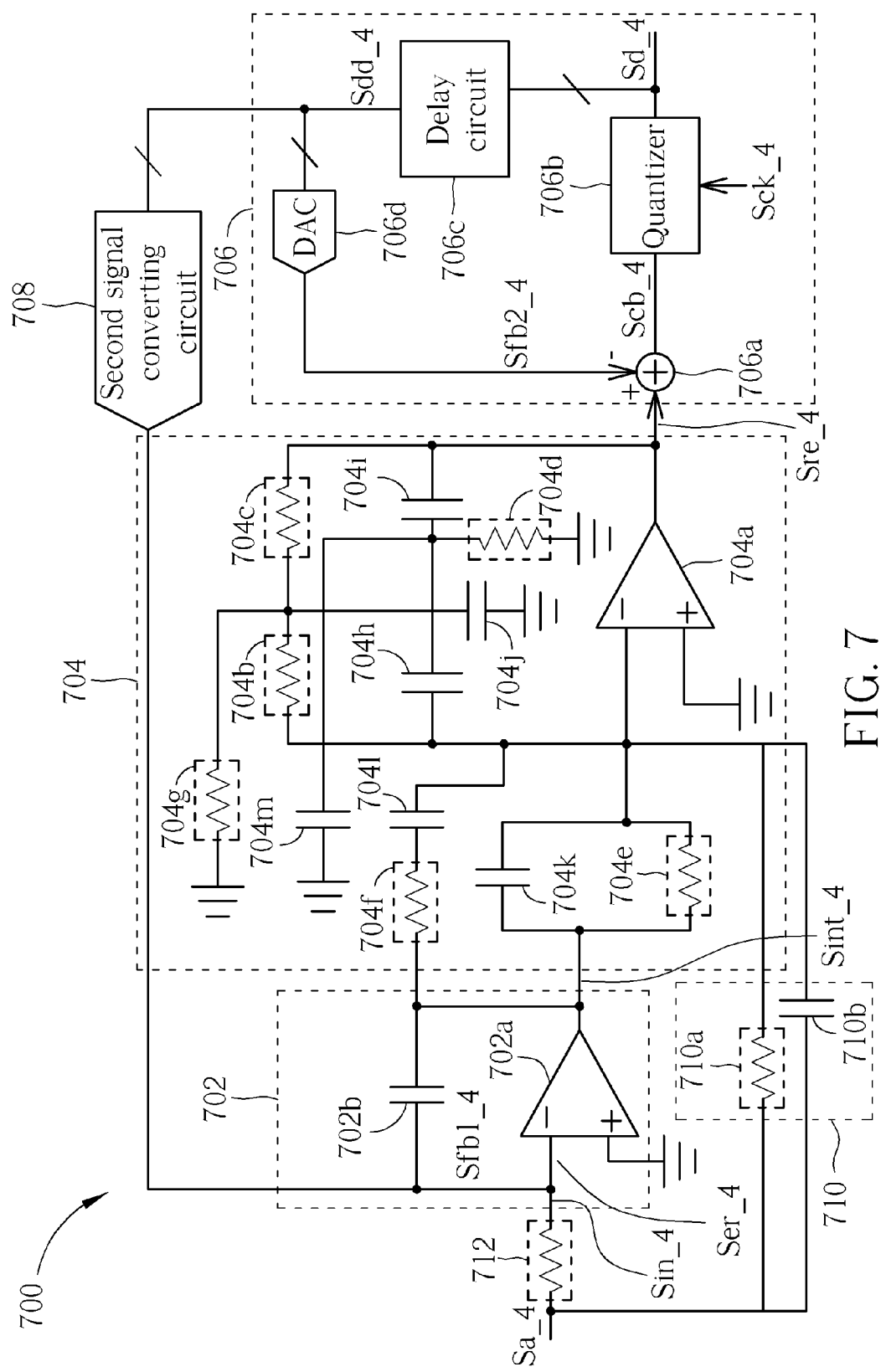
FIG. 7 is a diagram illustrating a single-ended continuous-time sigma-delta modulating device according to a fourth embodiment of the present invention.

Please refer to FIG. 7, which is a diagram illustrating a single-ended continuous-time sigma-delta modulating device 700 according to a fourth embodiment of the present invention. FIG. 7 shows a detailed schematic of another embodiment of the signal modulating device 100. The single-ended continuous-time sigma-delta modulating device 700 comprises an integrating circuit 702, a resonating circuit 704, a first signal converting circuit 706, a second signal converting circuit 708, a first impedance circuit 710, and a second impedance circuit 712. The integrating circuit 702 comprises an amplifying circuit 702a and a capacitor 702b. The amplifying circuit 702a has a first input terminal (i.e. the negative input terminal) receiving a combining signal Ser_4 of a scaled analog signal Sin_4 and a first feedback signal Sfb1_4, and a second input terminal (i.e. the positive input terminal) coupled to a reference voltage. The capacitor 702b has a first terminal coupled to the first input terminal of the amplifying circuit 702a and a second terminal coupled to an output terminal of the amplifying circuit 702a for outputting an integrated signal Sint_4.

The resonating circuit 704 comprises an amplifying circuit 704a, a plurality of resistors 704b-704g, and a plurality of capacitors 704h-704m. The amplifying circuit 704a is an operational amplifier having a negative input terminal, a positive input terminal, and an output terminal. The resistors 704b, 704c, and the capacitor 704j are configured to be a first feedback circuit of the amplifying circuit 704a, and the first feedback circuit is coupled between the negative input terminal and the output terminal of the amplifying circuit 704a. The capacitors 704h, 704i, and the resistor 704d are configured to be a second feedback circuit of the amplifying circuit 704a, and the second feedback circuit is coupled between the negative input terminal and the output terminal of the amplifying circuit 704a. The resistors 704e, 704f, 704g, and the capacitors 704k, 704l, 704m are configured to be a gain-adjusting circuit of the resonating circuit 704, and the gain-adjusting circuit is coupled to the negative input terminal of the amplifying circuit 704a, the intermediate terminal of the first feedback circuit (i.e. the common node of the resistors 704b, 704c, 704g, and the capacitor 704j), and the intermediate terminal of the second feedback circuit (i.e. the common node of the capacitors 704h, 704i, 704m, and the resistor 704d). The resonating circuit 704 is arranged to generate a resonating signal Sre_4 according to the integrated signal Sint_4. The connectivity of the elements in the resonating circuit 704 is shown in FIG. 7, thus the detailed description is omitted here for brevity.

The first signal converting circuit 706 comprises a combining circuit 706a, a quantizer 706b, a delay circuit 706c, and a digital-to-analog converter 706d. The combining circuit 706a is arranged to generate a combining signal Scb_4 according to the resonating signal Sre_4 and a second feedback signal Sfb2_4. The quantizer 706b is clocked by a clock signal Sck_4 and is arranged to generate the digitized output signal Sd_4 of the combining signal Scb_4 in each clock period. The delay circuit 706c is arranged to delay the digital output signal Sd_4 to generate a delayed signal Sdd_4. The digital-to-analog converter 706d is arranged to generate the second feedback signal Sfb2_4 according to the delayed signal Sdd_4. According to the embodiment, the combining signal Scb_4 is a difference between the resonating signal Sre_4 and the second feedback signal Sfb2_4.

In addition, the second signal converting circuit 708 is arranged to convert the delayed signal Sdd_4, which is derived of the digital output signal Sd_4, into the first feedback signal Sfb1_4. The second impedance circuit 712 is a resistor having a first terminal receiving an analog signal Sa_4 and a second terminal coupled to the integrating circuit 702 for generating the scaled analog signal Sin_4. It is noted that the integrating circuit 702 generates the integrated signal Sint_4 according to the scaled analog signal Sin_4 and the first feedback signal Sfb1_4. The first impedance circuit 710 comprises a resistor 710a and a capacitor 710b. The resistor 710a has a first terminal for receiving the analog signal Sa_4, and a second terminal coupled to the negative input terminal of the amplifying circuit 704a. The capacitor 710b also has a first terminal for receiving the analog signal Sa_4, and a second terminal coupled to the negative input terminal of the amplifying circuit 704a.

As the first impedance circuit 710 is a frequency-independent component, i.e. the resistor 710a, in combination with a frequency-dependent component, i.e. the capacitor 710b, the response of the single-ended continuous-time sigma-delta modulating device 700 is similar to the curve 206 as shown in FIG. 2.

Briefly, by using frequency-independent components alone or in combination with frequency-dependent components to couple between the input terminal of the modulating device and the negative input terminal of the amplify circuit in the twin-T filter, zeros in forward-path transfer function can be manipulated in different ways so that the peak in the STF response of a continuous-time sigma-delta modulating device is effectively reduced or eliminated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A signal modulating device, comprising:
an integrating circuit, arranged to generate an integrated signal according to a scaled analog signal and a first feedback signal;
a resonating circuit, arranged to generate a resonating signal according to the integrated signal;

a first signal converting circuit, arranged to convert the resonating signal into a digital output signal;
a second signal converting circuit, arranged to convert the digital output signal into the first feedback signal;
a first impedance circuit, having a first terminal receiving an analog signal and a second terminal coupled to the resonating circuit for altering the location of zeros in the forward-path transfer function and consequently shaping the signal transfer function (STF) of the signal modulating device; and
a second impedance circuit, having a first terminal receiving the analog signal and a second terminal coupled to the integrating circuit for generating the scaled analog signal.

2. The signal modulating device of claim 1, wherein the second impedance circuit is a resistor.

3. The signal modulating device of claim 1, wherein the integrating circuit comprises:
a combining circuit, arranged to generate a combining signal according to the scaled analog signal and the first feedback signal; and
an integrator, arranged to integrate the combining signal to generate the integrated signal.

4. The signal modulating device of claim 3, wherein the combining signal is a difference between the scaled analog signal and the first feedback signal.

5. The signal modulating device of claim 3, wherein the integrator comprises:
an amplifying circuit, having a first input terminal receiving the combining signal and a second input terminal coupled to a reference voltage; and
a capacitor, having a first terminal coupled to the first input terminal of the amplifying circuit and a second terminal coupled to an output terminal of the amplifying circuit;
wherein the output terminal of the amplifying circuit is arranged to output the integrated signal.

6. The signal modulating device of claim 1, wherein the resonating circuit comprises:
an amplifying circuit, having an output terminal for outputting the resonating signal;
a first feedback circuit, coupled between a first input terminal of the amplifying circuit and the output terminal of the amplifying circuit;
a second feedback circuit, coupled between the first input terminal of the amplifying circuit and the output terminal of the amplifying circuit; and
a gain-adjusting circuit, having a first input terminal for receiving the integrated signal, a second input terminal coupled to a reference voltage, a first output terminal coupled to the first input terminal of the amplifying circuit, a second output terminal coupled to the intermediate terminal of the first feedback circuit, and a third output terminal coupled to the intermediate terminal of the second feedback circuit;
wherein the equivalent impedance on the intermediate terminal of the first feedback circuit substantially equals the equivalent impedance on the intermediate terminal of the second feedback circuit, and the gain-adjusting circuit is arranged to tune the transfer gain from the integrated signal to the resonating signal, and the amplifying circuit further comprises a second input terminal, and the second input terminal is coupled to a reference voltage.

7. The signal modulating device of claim 6, wherein the first feedback circuit comprises:
a first resistor, having a first terminal coupled to the first input terminal of the amplifying circuit;

a second resistor, having a first terminal coupled to a second terminal of the first resistor, and a second terminal coupled to the output terminal of the amplifying circuit; and
a first capacitor, having a first terminal coupled to the second terminal of the first resistor, and a second terminal coupled to a reference voltage;
wherein the second terminal of the first resistor is the intermediate terminal of the first feedback circuit.

8. The signal modulating device of claim 7, wherein the second feedback circuit comprises:
a second capacitor, having a first terminal coupled to the first input terminal of the amplifying circuit;
a third capacitor, having a first terminal coupled to a second terminal of the second capacitor, and a second terminal coupled to the output terminal of the amplifying circuit; and
a third resistor, having a first terminal coupled to the second terminal of the second capacitor, and a second terminal coupled to the reference voltage;
wherein the second terminal of the second capacitor is the intermediate terminal of the second feedback circuit.

9. The signal modulating device of claim 8, wherein the gain-adjusting circuit comprises:
a fourth resistor, having a first terminal for receiving the integrated signal, and a second terminal coupled to the first input terminal of the amplifying circuit;
a fourth capacitor, having a first terminal for receiving the integrated signal, and a second terminal coupled to the first input terminal of the amplifying circuit;
a fifth capacitor, having a first terminal for receiving the integrated signal, and a second terminal coupled to the second terminal of the second capacitor; and
a fifth resistor, having a first terminal coupled to the reference voltage, and a second terminal coupled to the second terminal of the first resistor.

10. The signal modulating device of claim 8, wherein the gain-adjusting circuit comprises:
a fourth resistor, having a first terminal for receiving the integrated signal, and a second terminal coupled to the first input terminal of the amplifying circuit;
a fourth capacitor, having a first terminal for receiving the integrated signal, and a second terminal coupled to the first input terminal of the amplifying circuit;
a fifth resistor, having a first terminal for receiving the integrated signal;
a fifth capacitor, having a first terminal coupled to a second terminal of the fifth resistor, and a second terminal coupled to the first input terminal of the amplifying circuit;
a sixth capacitor, having a first terminal coupled to the reference voltage, and a second terminal coupled to the second terminal of the second capacitor; and
a sixth resistor, having a first terminal coupled to the reference voltage, and a second terminal coupled to the second terminal of the first resistor.

11. The signal modulating device of claim 6, wherein the first impedance circuit comprises:
a resistor, having a first terminal for receiving the analog signal, and a second terminal coupled to the first input terminal of the amplifying circuit.

12. The signal modulating device of claim 11, wherein the first impedance circuit further comprises:
a capacitor, having a first terminal for receiving the analog signal, and a second terminal coupled to the first input terminal of the amplifying circuit.

13. The signal modulating device of claim 1, wherein the first signal converting circuit comprises:
   a combining circuit, arranged to generate a combining signal according to the resonating signal and a second feedback signal;
   a quantizer, arranged to generate the digital output signal according to the combining signal and a clock signal;
   a delay circuit, arranged to delay the digital output signal to generate a delayed signal; and
   a digital-to-analog converter, arranged to generate the second feedback signal according to the delayed signal.

14. The signal modulating device of claim 13, wherein the combining signal is a difference between the resonating signal and the second feedback signal.

15. The signal modulating device of claim 14, wherein the second signal converting circuit is a digital-to-analog converter, arranged to generate the first feedback signal according to the digital output signal of the first signal converting circuit.

16. The signal modulating device of claim 1, which is a continuous-time sigma-delta modulator.

\* \* \* \* \*